(12) United States Patent
Asghari et al.

(10) Patent No.: US 10,634,725 B2
(45) Date of Patent: Apr. 28, 2020

(54) SYSTEM AND METHOD FOR MODEL PREDICTIVE ENERGY STORAGE SYSTEM CONTROL

(71) Applicant: NEC Laboratories America, Inc., Princeton, NJ (US)

(72) Inventors: Babak Asghari, San Jose, CA (US);
Ratnesh Sharma, Fremont, CA (US);
Mohammad Ehsan Raoufat, E. Raleigh, NC (US)

(73) Assignee: NEC Corporation (JP)

( * ) Notice: Subject to any disclaimer, the term of this patent is extended or adjusted under 35 U.S.C. 154(b) by 28 days.

(21) Appl. No.: 16/103,970

(22) Filed: Aug. 16, 2018

(65) Prior Publication Data

US 2019/0056451 A1 Feb. 21, 2019

Related U.S. Application Data

(60) Provisional application No. 62/547,175, filed on Aug. 18, 2017.

(51) Int. Cl.
*H02J 7/00* (2006.01)
*G01R 31/382* (2019.01)
(Continued)

(52) U.S. Cl.
CPC ....... *G01R 31/382* (2019.01); *G01R 31/3646* (2019.01); *H02J 3/32* (2013.01);
(Continued)

(58) Field of Classification Search
USPC ........................................................ 320/132
See application file for complete search history.

(56) References Cited

U.S. PATENT DOCUMENTS

| 8,332,169 B2 * | 12/2012 | Kang | .................. | G01R 31/392 |
| | | | | 702/63 |
| 2014/0225622 A1 * | 8/2014 | Kudo | .................. | B60L 3/0046 |
| | | | | 324/433 |

(Continued)

OTHER PUBLICATIONS

Litjens et al., On the Influence of Electricity Demand Patterns, Battery Storage and PV System Design on PV Self-Consumption and Grid Interaction, 2016 IEEE 43rd Photovoltaic Specialists Conference (PVSC), Jun. 2016, pp. 2021-2024.

(Continued)

*Primary Examiner* — Samuel Berhanu
(74) *Attorney, Agent, or Firm* — Joseph Kolodka

(57) ABSTRACT

Systems and methods for controlling Battery Energy Storage Systems (BESSs), including determining historical minimum state of charge (SOC) for peak shaving of a previous day based on historical photovoltaic (PV)/load profiles, historical demand charge thresholds (DCT), and battery capacity of the BESSs. A minimum SOC for successful peak shaving of a next day is estimated by generating a weighted average based on the historical minimum SOC, and optimal charging/discharging profiles for predetermined intervals are generated based on estimated PV/load profiles for a next selected time period and grid feed-in limitations. Continuous optimal charging/discharging functions are provided for the one or more BESSs using a real-time controller configured for overriding the optimal charging/discharging profiles when at least one of a high excess PV generation, a peak shaving event, or a feed-in limit violation is detected.

20 Claims, 9 Drawing Sheets

(51) Int. Cl.
　　　*H02S 20/23*　　(2014.01)
　　　*H02S 40/30*　　(2014.01)
　　　*G01R 31/36*　　(2020.01)
　　　*H02J 3/32*　　(2006.01)
　　　*H02J 3/38*　　(2006.01)
　　　*H02J 7/04*　　(2006.01)

(52) U.S. Cl.
　　　CPC ............ *H02J 3/383* (2013.01); *H02J 7/0021* (2013.01); *H02J 7/0022* (2013.01); *H02J 7/0077* (2013.01); *H02J 7/045* (2013.01); *H02S 20/23* (2014.12); *H02S 40/30* (2014.12); *H02J 2203/20* (2020.01)

(56) References Cited

U.S. PATENT DOCUMENTS

2015/0028814 A1\* 1/2015 Johnson .................. B60L 58/13
　　　　　　　　　　　　　　　　　　　　　　　　320/134

2015/0149799 A1\* 5/2015 Ye .......................... G06F 1/263
　　　　　　　　　　　　　　　　　　　　　　　　713/320
2015/0268643 A1\* 9/2015 Patil ........................ H02S 10/00
　　　　　　　　　　　　　　　　　　　　　　　　700/287

OTHER PUBLICATIONS

Vrettos et al., "Maximizing Local PV Utilization Using Small-Scale Batteries and Flexible Thermal Loads", 28th European Photovoltaic Solar Energy Conf. and Exhibition, Oct. 2013, pp. 4515-4526.

Williams et al., "Demand Side Management through Heat Pumps, Thermal Storage and Battery Storage to Increase Local Self-Consumption and Grid Compatibility of PV Systems", 2012 3rd IEEE PES Innovative Smart Grid Technologies Europe (ISGT Europe), Oct. 2012, pp. 1-6.

\* cited by examiner

SYSTEM AND METHOD FOR MODEL PREDICTIVE ENERGY STORAGE SYSTEM CONTROL

RELATED APPLICATION INFORMATION

This application claims priority to U.S. Provisional Application No. 62/547,175, filed on Aug. 18, 2018, incorporated herein by reference herein its entirety.

BACKGROUND

Technical Field

The present invention relates to management of energy storage systems, and more particularly to management of energy storage systems to maximize PV-utilization and provide optimal charging and discharging while minimizing demand charge costs.

Description of the Related Art

Recently, growing penetration of rooftop PV generation is causing operational challenges for utility companies to keep the voltage within an acceptable range. Consequently, new studies have been focused on using behind-the-meter (BTM) battery energy storage systems (BESSs) to increase the local PV-utilization. However, a major obstacle in combining DC management and PV-utilization service lies in their opposing nature, namely that DC reduction works better when a BESS is fully charged and ready to shave the peak, while PV-utilization prefers a battery which is not fully charged and ready to store the excess generation. Studies have been performed regarding the influence of load patterns on PV-self consumption, but do not provide any type of controller mechanism for charging/discharging functions. A "delayed charging" algorithm has also been proposed to increase the state of charge (SOC) every 15-minutes in a linear fashion. However, in the case of, for example, peak shaving event in early hours, there is not enough energy stored in the battery using such conventional systems and methods. Another study has suggested using batteries and flexible loads to increase the PV utilization, but does not address the problem of DC management, controllable loads, or overall charging/discharging functions for BESSs.

Conventional rule-based controllers have been used to only discharge the battery when the grid power is higher than the DC threshold and fully charge the battery when the demand is lower than the DC threshold. Although this controller is successful in DC management, it is not able to capture the excess PV production and prevent curtailment. Moreover, conventional systems and methods lead to high average annual state of charge (SOC), which reduces the overall battery lifetime.

SUMMARY

According to an aspect of the present principles, a computer implemented method is provided for controlling Battery Energy Storage Systems (BESSs), including determining historical minimum state of charge (SOC) for peak shaving of a previous day based on historical photovoltaic (PV)/load profiles, historical demand charge thresholds (DCT), and battery capacity of the BESSs. A minimum SOC for successful peak shaving of a next day is estimated by generating a weighted average based on the historical minimum SOC, and optimal charging/discharging profiles for predetermined intervals are generated based on estimated PV/load profiles for a next selected time period and grid feed-in limitations. Continuous optimal charging/discharging functions are provided for the one or more BESSs using a real-time controller configured for overriding the optimal charging/discharging profiles when at least one of a high excess PV generation, a peak shaving event, or a feed-in limit violation is detected.

According to another aspect of the present principles, a system is provided for controlling Battery Energy Storage Systems (BESSs), including a processor device operatively coupled to a non-transitory computer-readable storage medium. A historical minimum state of charge (SOC) for peak shaving of a previous day is determined based on historical photovoltaic (PV)/load profiles, historical demand charge thresholds (DCT), and battery capacity of the BESSs. A minimum SOC for successful peak shaving of a next day is estimated by generating a weighted average based on the historical minimum SOC, and optimal charging/discharging profiles for predetermined intervals are generated based on estimated PV/load profiles for a next selected time period and grid feed-in limitations. Continuous optimal charging/discharging functions are provided for the one or more BESSs using a real-time controller configured for overriding the optimal charging/discharging profiles when at least one of a high excess PV generation, a peak shaving event, or a feed-in limit violation is detected.

According to another aspect of the present principles, a computer-readable storage medium including a computer-readable program is provided, and the computer-readable program when executed on a computer causes the computer to determine a historical minimum state of charge (SOC) for peak shaving of a previous day based on historical photovoltaic (PV)/load profiles, historical demand charge thresholds (DCT), and battery capacity of the one or more BESSs. A minimum SOC for successful peak shaving of a next day is estimated by generating a weighted average based on the historical minimum SOC, and optimal charging/discharging profiles for predetermined intervals are generated based on estimated PV/load profiles for a next selected time period and grid feed-in limitations. Continuous optimal charging/discharging functions are provided for the one or more BESSs using a real-time controller configured for overriding the optimal charging/discharging profiles when at least one of a high excess PV generation, a peak shaving event, or a feed-in limit violation is detected.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
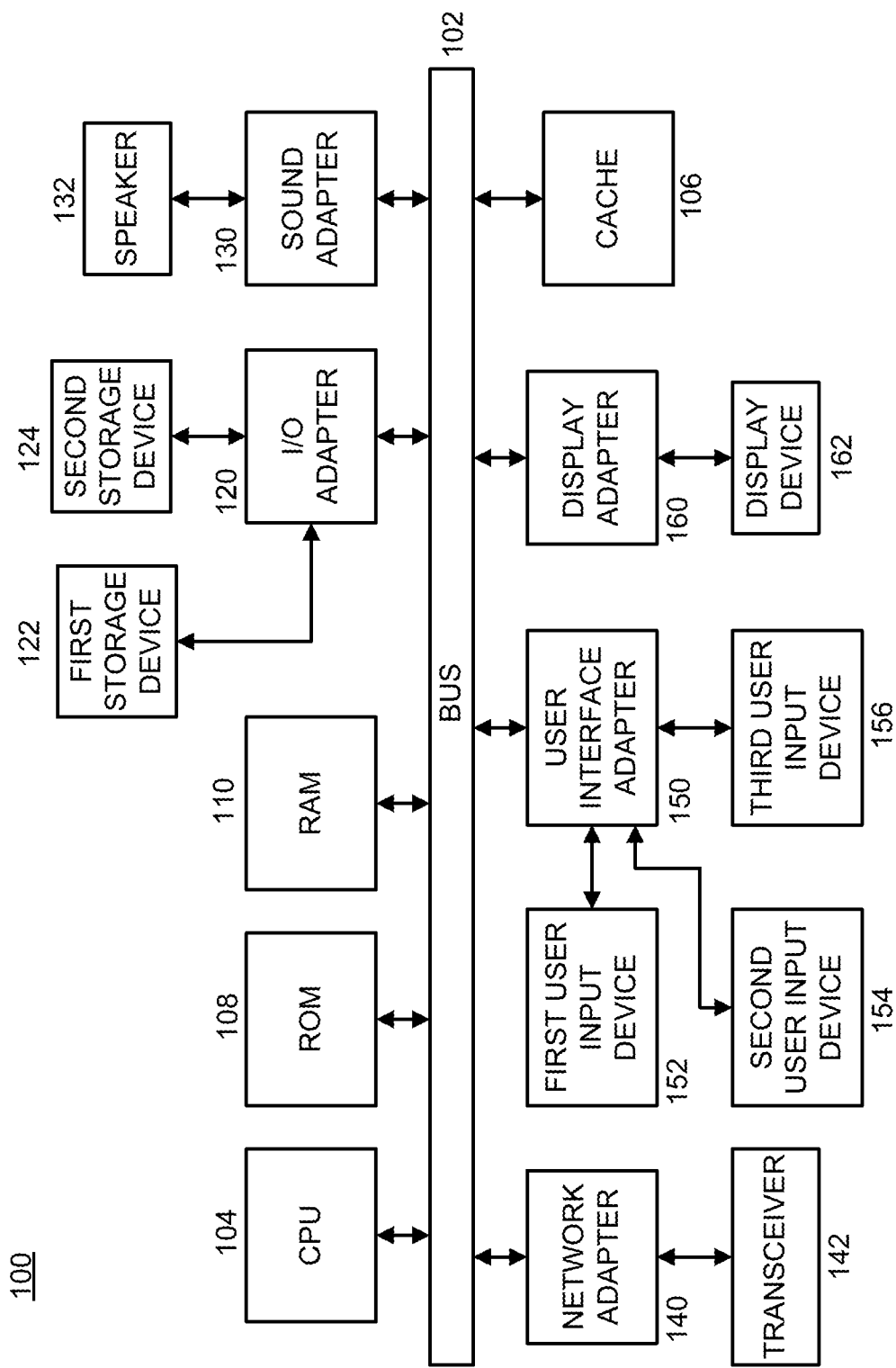
FIG. 1 is a block/flow diagram illustrating an exemplary processing system to which the present principles may be applied, in accordance with the present principles.

In accordance with the present principles, systems and methods are provided for real-time management of energy storage systems to maximize PV-utilization and provide optimal charging and discharging functions while minimizing demand charge costs.

In one embodiment, systems and methods for real-time management of energy storage systems using a model predictive control (MPC) controller based on generated optimal charging/discharging profiles for one or more predetermined time periods (e.g., 15-minutes intervals) are described in accordance with the present principles. A benefit of the present systems and methods is minimization of the total excess PV generation sold to the grid and battery degradation costs. One or more constraints can be employed to guarantee that the DC thresholds will not be violated, keep the energy storage within the operational boundary, and avoid feed-in limitations in accordance with various embodiments. In some embodiments, energy storage systems (ESSs) may be controlled such that the battery discharges in the hours before high PV generations, and/or charges in the hours before peak demands to ensure sufficient battery capacity is available for one or more services in accordance with the present principles.

In accordance with various embodiments, generated battery charging/discharging profiles can then be sent to the real-time controller to adjust charging/discharging functions as necessary when providing power to, for example, a commercial building. If the system determines it to be necessary at a particular time, charging and discharging profiles/guidelines may be overridden based on a set of rules used by the real-time controller to ensure proper charging in the case of, for example, excess PV more than feed-in limitations, and discharging in the case of possible DC violations. Moreover, the real-time controller enables successful implementations in a faster time scale (e.g. order of seconds) than any conventional systems, in accordance with various embodiments of the present principles.

In some embodiments, BESSs for BTM applications offer valuable benefits for both the utility and the customers. However, the popularity of these storage systems mainly depends on the extent to which they can provide valuable services at a reasonable cost. In some recent applications, BESSs are assigned and dispatched according to a single primary objective such as demand charge (DC) management. However, the economic value of the BESS to the utility and to the end users can be far greater. BTM energy storage systems for commercial & industrial (C&I) segments can also be available to generate additional revenues by delivering services such as frequency regulation, ramp rate control, and PV-utilization in accordance with the present principles. A key point is that while the benefit/cost ratio for a single application may not be favorable, stacked services can provide multiple revenue streams for the same investment. Ultimately, the effectiveness at least partially can rely on the extent to which cooperative interaction exist among these services.

In accordance with various embodiments, from a distribution utility's point of view, maximizing the PV-utilization (e.g., local PV utilization) in accordance with the present principles reduces the voltage fluctuations, improves the reliability issues, and minimizes the loss in distribution networks. Additionally, commercial and industrial (C&I) and residential customers can benefit from incentive support programs for self-consumptions, and avoid the reduced PV feed-in tariff while increasing the demand charge savings at the same time. The systems and methods according to the present principles also prevents unnecessary curtailment of PV generation by, for example, absorbing the excess energy in case of over generation, prevent curtailment loss due to feed-in limitations, and avoid the reduced PV feed-in tariff while providing other services at the same time. For instance, during a daily operation, a BTM BESS can discharge to reduce the peak demand and also charge by absorb the excess PV generation locally. Moreover, the average annual SOC can be reduced, and battery lifetime can be increased by using the real-time controller in accordance with the present principles.

In some embodiments, a new model predictive controller (MPC) is employed to reduce the peak power injection from the grid and increase the PV-utilization level for BTM applications at the same time. These services can be provided during the day through the optimal shift of load and PV generation in time. In our approach, peak shaving is of key concern and the MPC controller calculates the optimal charging/discharging guidelines for regular, predetermined intervals (e.g., 15-minutes intervals), which will then be sent to the real-time controller to ensure robust real-time operation. If determined to not be necessary, charging and discharging profiles are overridden using a set of rules to provide optimal charging/discharging functions. In addition, the MPC according to the present principles also accounts for battery degradation and operational boundaries. Simulations have been performed using real data for different types of loads, battery sizes, and optimization horizons. The results show that the systems and methods according to the present principles have improved performance (e.g., PV-utilization performance) as compared to systems using conventional rule-based controllers. In some embodiments, the rule-based controller in accordance with the present principles is further configured to reduce the average annual SOC and increase the battery lifetime.

Controlling battery energy storage systems (BESSs) for behind-the-meter (BTM) applications in accordance with the present principles provides valuable benefits, particularly for demand charge (DC) management. Moreover, the economic value of the BESS to the utility and to the end users is greatly improved as compared to conventional systems and methods. To improve the economic revenue of BESS, axillary services such as PV-utilization and curtailment avoidance can be incorporated into battery energy management systems. From the utility's point of view, maximizing the local PV-utilization reduces voltage fluctuations, improves power quality, and minimizes the loss in distribution networks.

Additionally, commercial & industrial (C&I) customers with energy storage systems can benefit from incentive support programs for self-consumptions, prevent curtailment loss due to feed-in limitations, and avoid the reduced PV feed-in tariff while DC management service. The systems and methods according to the present principles determines optimal charging and discharging profiles, and provides a controller mechanism for charging and discharging operations which minimize the DC cost, enhance the PV-utilization, and avoid the potential curtailment loss at the same time in accordance with various embodiments.

In accordance with various embodiments, some key features and advantages of the present invention include a minimum required SOC calculation using historical data to avoid DC thresholds violations; adjusting a weighted average to, for example, assign a heavier weighting to more recent data and vice versa; and a Model Predictive Controller (MPC) configured to calculate the optimal charging/discharging guidelines to minimize the DC cost, enhance the PV-utilization, and avoid unnecessary generation curtailment. The present invention further reduces the average annual SOC, increases the battery lifetime, and a real-time controller is used for real-time operation and to override the control signal in case of possible violations in accordance with the present principles.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

Each computer program may be tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

In this paper, the following notations are used to represent various functions of the present invention:

| | |
|---|---|
| $n_{pv}$ | Photovoltaic (PV)-utilization rate |
| $P_g^{pur}$, $P_g^{sell}$ | Purchased/sold power from/to grid (kW) |
| $P_{load}$, $P_{pv}$ | Load/PV power (kW) |
| $P_b^{cha}$, $P_b^{dis}$ | Battery Energy Storage System (BESS) charge/discharge power (kW) |
| $E_{BESS}^{sell}$, $P_{NoBESS}^{sell}$ | Excess energy sold to the grid with or without BESS (kWh) |
| SOC | BESS State-of-Charge |
| DCT | Demand Charge Threshold (kW) |
| $\lambda_{DC}$ | Demand Charge Rate ($/kW) |
| $C_{tp}$ | Battery Throughput Cost ($/kW) |

Referring now in detail to the figures in which like numerals represent the same or similar elements and initially to FIG. 1, a block/flow diagram showing an exemplary processing system 100 to which the present principles may be applied is illustratively depicted in accordance with an embodiment of the present principles.

In one embodiment, the processing system 100 includes at least one processor (CPU) 104 operatively coupled to other components via a system bus 102. A cache 106, a Read Only Memory (ROM) 108, a Random Access Memory (RAM) 110, an input/output (I/O) adapter 120, a sound adapter 130, a network adapter 140, a user interface adapter 150, and a display adapter 160, are operatively coupled to the system bus 102.

A first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 152, 154, and 156 can be the same type of user input device or different types of user input devices. The user input devices 152, 154, and 156 are used to input and output information to and from system 100.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present principles provided herein.

Moreover, it is to be appreciated that systems 100, 200, 400, 500, 600, 700, 800, and 900, described with respect to FIGS. 1, 2, 4, 5, 6, 7, 8, and 9, respectively, are systems for implementing respective embodiments of the present principles. Part or all of processing system 100 may be implemented in one or more of the elements of systems 200, 400, 500, 600, 700, 800, and 900, according to various embodiments of the present principles.

Further, it is to be appreciated that processing system 100 may perform at least part of the method described herein including, for example, at least part of methods 300, 400, 500, 600, 700, and 800 of FIGS. 3, 4, 5, 6, 7, and 8, respectively. Similarly, part or all of system 800 may be used to perform at least part of methods 300, 400, 500, 600, 700, and 800 of FIGS. 3, 4, 5, 6, 7, and 8, respectively, according to various embodiments of the present principles.

Figure 2:
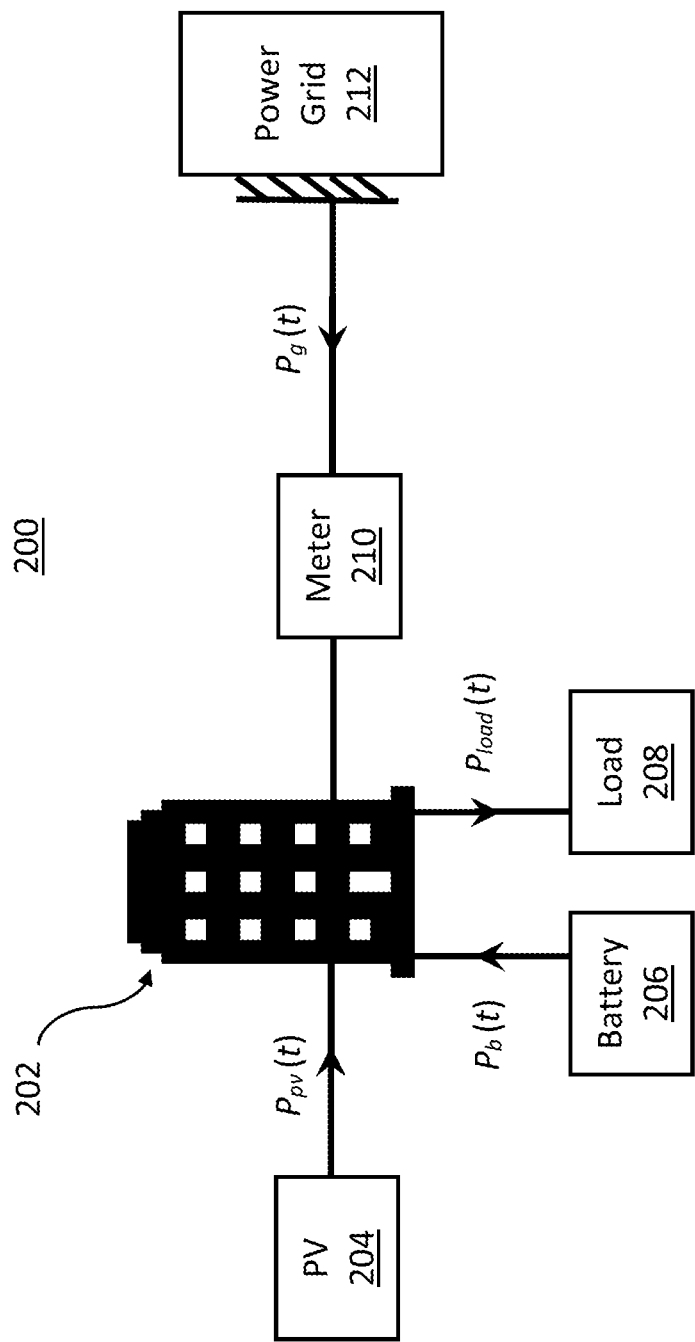
FIG. 2 is a high-level block diagram illustrating a system for real-time management of energy storage systems in commercial and/or residential buildings, in accordance with the present principles.

Referring now to FIG. 2, a high-level system 200 for real-time management of energy storage systems in commercial and/or residential buildings is illustratively depicted in accordance with an embodiment of the present principles.

In one embodiment, the system 200 is a behind-the-meter 210 system, and controls the power charging and discharging for a building 200 (e.g., Commercial, industrial, residential). The system may include a load 208 served by a photovoltaic (PV) power generating system 204, which can be used to complement the main power grid 212 and/or a battery energy storage system (BESS) 206 in accordance with various embodiments.

In accordance with various embodiment, optimal power balance for the system 200 may be determined as follows:

$$P_{pv}(t) + P_b(t) + P_g(t) - P_{load}(t) = 0 \quad (1)$$

$$P_b(t) = P_b^{dis}(t) - P_b^{cha}(t) \quad (2)$$

$$P_g(t) = P_g^{pur}(t) - P_g^{sell}(t) \quad (3),$$

where $P_{pv}$ represents PV-power, $P_{load}$ represents power load, $P_g$ represents grid power, $P_b^{cha}$ represents BESS charge power, $P_b^{dis}$ represents BESS discharge power, t represents time, $P_g^{pur}$ represents power purchased from the energy grid, $P_g^{dis}$ represents power sold to the energy grid, and $P_b$ represents a control variable. In the above equations, the only control variable is $P_b$, while the other variables represent disturbances, and the present principles may be applied to uncontrollable loads in accordance with various embodiments.

In some embodiments, various parameters relevant for BESS performance are employed for determining optimal battery charging/discharging functions in accordance with the present principles. Some major parameters utilized/ controlled by the present system 200 are PV-utilization Rate ($n_{pv}$), defined as one minus the ratio between the excess PV energy injected to the grid with BESS and without BESS (e.g., measured in days, months, years, etc.) and may be calculated as follows:

$$n_{pv} = 1 - \frac{E_{BESS}^{sell}}{E_{NoBESS}^{sell}}, \quad (4)$$

curtailment loss (LS), defined as an involuntary reduction in the PV power sold to the grid due to feed-in limitations, and demand charge (DC) cost ($J_{DC}$) for an electric bill, which can be calculated for an entire month by summing three components of anytime, partial peak, and peak power measured by the utility grid as follows:

$$J_{DC} = \lambda_{DC}^{any} \times \max_{\forall t}[P_g(t)] + \lambda_{DC}^{partial} \times \max_{t \in p.p.t}[P_g(t)] + \lambda_{DC}^{peak} \times \max_{max_{t \in p.t.}}[P_g(t)] \quad (5)$$

In some embodiments, to address the problem of DC cost, the energy management system 200 according to the present principles may be implemented as a two-layer architecture including monthly and daily layers as described in further detail herein below. An objective of the monthly layer is to calculate the optimal peak grid powers to follow during the next billing cycle. These target grid powers are calculated based on regular, predetermined time intervals (e.g., 15-minute intervals) and are referred to as demand charge thresholds (DCTs). It is noted that PV-utilization is a daily problem. However, demand charge is a monthly problem and may be already defined using historical data for the current month. As a result, during daily operation, the aggregated system can efficiently provide power by following predefined thresholds (e.g., DC thresholds) calculated in the monthly layer, which will be described in further detail herein below.

In some embodiments, the daily layer is responsible for the continuous adjustment of battery power and grid power based on the most recent information in real-time. The rule-based controller in accordance with the present principles can be used in the daily layer to track DCT values generated in the monthly layer as follows:

| Algorithm 1: Rule-Based Controller |  |
|---|---|
| Case1: | if $(P_g(t) \leq DCT(t))$ & $(SOC(t) \leq SOC_{max}$ <br> $P_b^{cha}(t) = DCT(t) - P_g(t)$ <br> $P_b^{dis}(t) = 0$ |
| Case 2: | if $(P_g(t) > DCT(t))$ & $(SOC(t) > SOC_{min}$ <br> $P_b^{cha}(t) = 0$ <br> $P_b^{dis}(t) = P_g(t) - DCT(t)$ |
| Otherwise: | $P_b^{cha}(t) = 0$ <br> $P_b^{dis}(t) = 0$ |

However, as is evident from the above algorithm, the above controller may always charge the battery as long as demand is below the DCT and may always discharge the battery when demand is above the DCT. Consequently, the battery is fully charged most of the time and thus does not have any available capacity to capture the excess PV generation using conventional rule-based controllers. However, as discussed in further detail herein below, utilizing the MPC-based controller according to the present principles provides significant improvements over the above rule-based controller at least with respect to maximizing PV-utilization and battery life by providing optimal charging and discharging functions for one or more BESSs in accordance with various embodiments.

Figure 3:
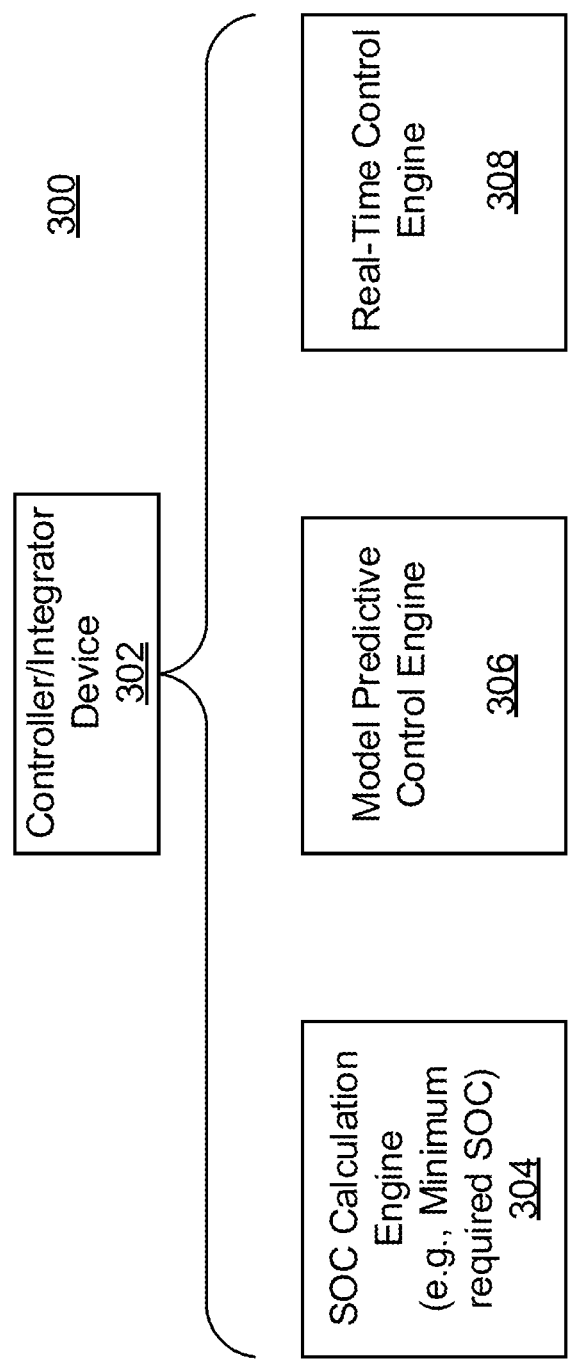
FIG. 3 is a high-level block/flow diagram illustrating a system/method for real-time management of energy storage systems, in accordance with the present principles.

Referring now to FIG. 3, a high-level block/flow diagram showing a system/method 300 for real-time management of energy storage systems is illustratively depicted in accordance with an embodiment of the present principles.

In one embodiment, a controller/integrator device 302 can be employed to improve PV-utilization and prevent curtailment loss while performing DC management for commercial and industrial customers by stacking services together to leverage full storage capabilities and increase economic benefits over conventional systems, in accordance with the present principles. As compared to conventional systems and methods, the systems and methods according to the present principles provides such advantages by determining optimal charging/discharging guidelines, which can be used to enhance the PV-utilization and prevent unnecessary curtailment while minimizing the DC cost. The invention delivers significant economic and PV-utilization benefits for both the utility and the customers in accordance with various embodiments.

In various embodiments, the controller/integrator device 302 provides real-time control of BESSs using a minimum required state-of-charge (SOC) calculation engine 304, a model predictive control engine 306, and a real-time control engine 308 in accordance with the present principles, which will be described in further detail herein below. The model predictive control engine 306 provides DC cost minimization, battery life enhancement, PV-utilization maximization, and curtailment minimization, the minimum required SOC calculation engine 304 provides a robustness improvement, and the real-time control engine 308 provides for implementation in faster time-scales than conventional systems, in accordance with various embodiments.

Figure 4:
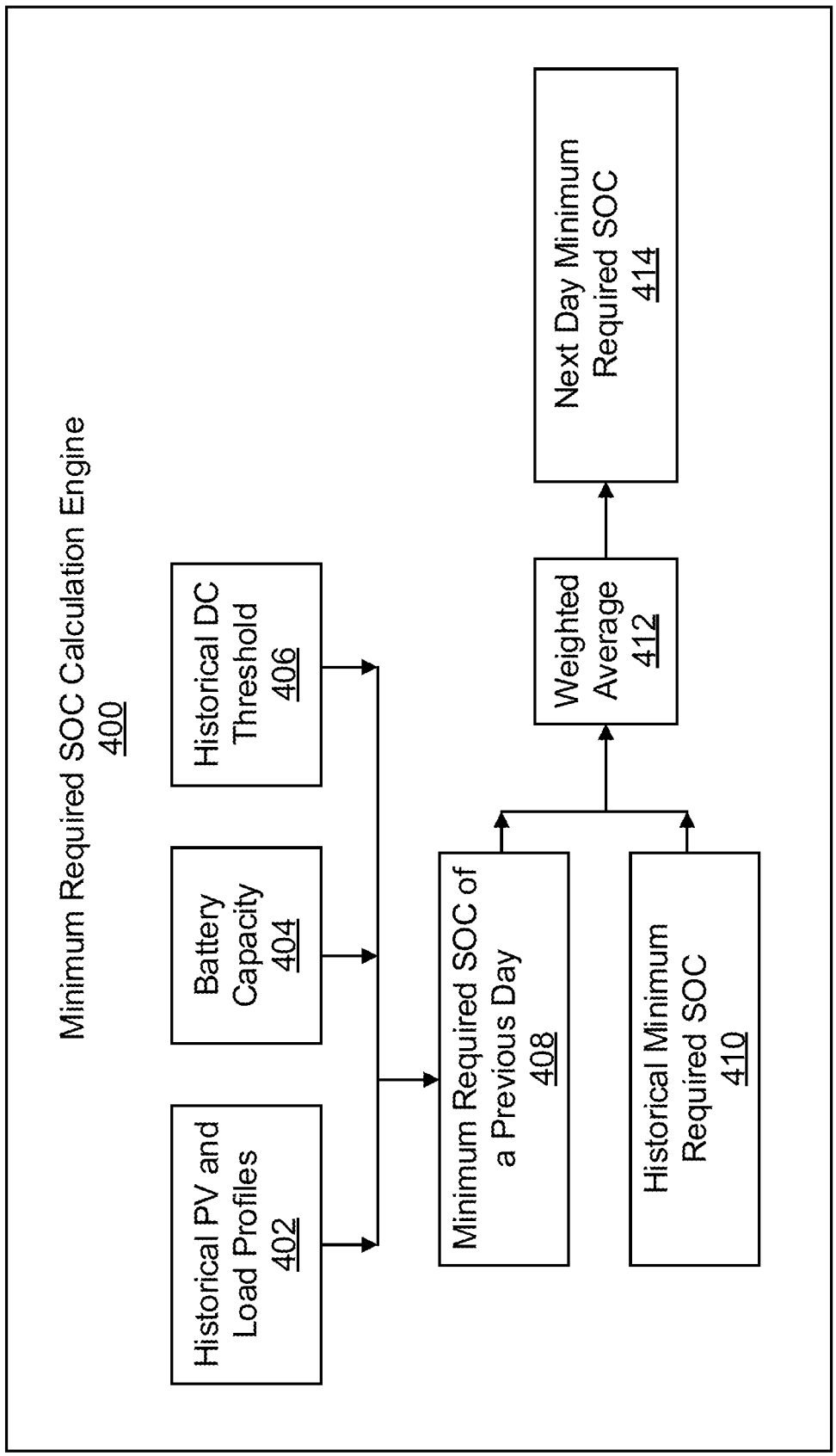
FIG. 4 is a high-level block/flow diagram illustrating a system/method for calculating a minimum required state of charge (SOC) for real-time management of energy storage systems, in accordance with the present principles.

Referring now to FIG. 4, a high-level block/flow diagram showing a system/method 400 for calculating a minimum required state of charge (SOC) for real-time management of energy storage systems is illustratively depicted in accordance with an embodiment of the present principles.

In one embodiment, historical PV and load profiles 402, battery capacity 404, and historical DC thresholds 406 can be input into the SOC calculation engine 400 to calculate the minimum required SOC for peak shaving of the previous day 408 in accordance with the present principles. Using an input historical minimum required SOC 410, a weighted average 412 may be employed to estimate a required amount of energy for successful peak shaving of the next day to determine a next day minimum required SOC 414. In some embodiments, the determined next day minimum required SOC 414 is sent to a model predictive control engine (further described with reference to FIG. 5, below) to be considered in generating optimal charging/discharging guidelines/profiles in accordance with the present principles.

In accordance with the present principles, the minimum required SOC calculation engine 400 calculates the minimum required SOC based on the historical data and will pass the results to a model predictive controller (MPC) to ensure that the battery in a BESS has enough energy for the process of peak shaving during the day. The system/method 400 provides a robustness improvement over conventional systems and methods by providing optimal peak shaving and maintaining the required SOC during a day, which significantly improves robustness against uncertainties in predicted PV/load profiles, in accordance with the present principles.

Figure 5:
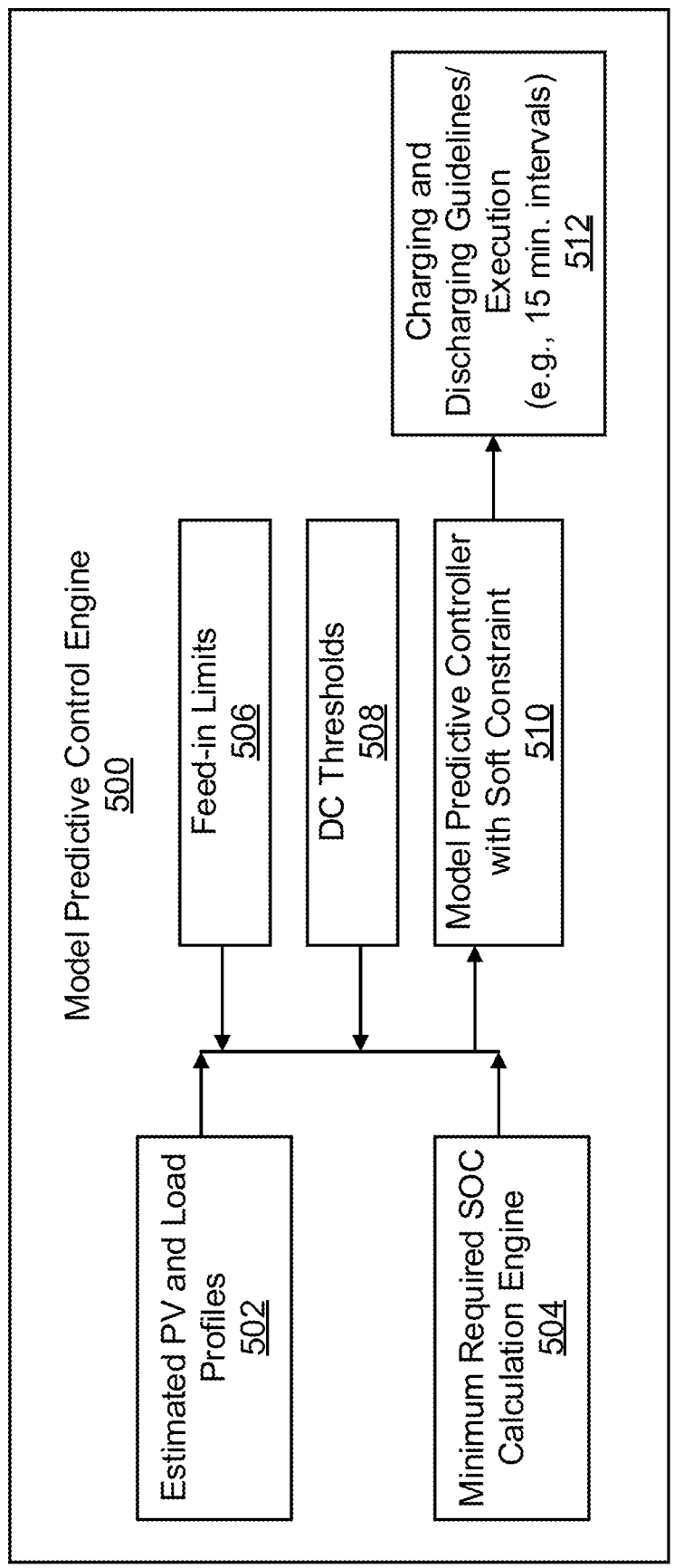
FIG. 5 is a high-level block/flow diagram illustrating a system/method for determining optimal charging and discharging profiles for real-time management of energy storage systems, in accordance with the present principles.

Referring now to FIG. 5, a high-level block/flow diagram showing a system/method 500 for determining optimal charging and discharging profiles for real-time management of energy storage systems is illustratively depicted in accordance with an embodiment of the present principles.

In one embodiment, PV and load profiles may be estimated using AutoRegressive Integrated Moving Average (ARIMA) models in block 502, and may be based on input including feed-in limits 506, and DC thresholds 508 in accordance with the present principles. The PV and load profiles 502 for a predetermined time period (e.g., 4 hours) and the estimated minimum required SOC 504 (e.g., as determined in block 414 of FIG. 4) may be employed as input into the model predictive controller 510, and the controller 510 generates and outputs optimal charging/discharging guidelines/profiles 512 for regular, predetermined intervals (e.g., 15 minute intervals), which are then sent as input to a real-time controller engine (further described with reference to FIG. 6, below) for real-time control of charging/discharging functions of one or more BESSs in accordance with the present principles.

In accordance with the present principles, the model predictive control (MPC) engine 500 can be used to solve a finite horizon constrained optimization problem at each of a plurality of time steps (e.g., 15 minutes) to determine optimal charging/discharging guidelines. This feature promotes the battery to discharge in hours before high PV generations or charging in hours before peak demands. In accordance with various embodiments, the MPC engine 500 provides at least the following advantages over conventional systems and methods: 1) DC Cost Minimization: the MPC engine 500 guarantees that the DC thresholds will not be violated and the MPC controller 510 tracks the predefined DC thresholds which lead to a lower DC cost; 2) Battery Life Enhancement: following the optimal charging/discharging guidelines 512 reduces the average annual SOC and consequently extends the battery lifetime, and the MPC engine 500 also accounts for battery degradation and operational boundaries (e.g., charging and discharging rate); 3) PV-utilization Maximization: the MPC engine 500 significantly improves the PV-utilization rates by having a battery which is not always fully charged. Increasing the PV-utilization provides benefits for both the grid and customer; and 4) Curtailment Minimization: the MPC engine 500 considers the grid feed-in limitations 506 and generates optimal charging/discharging profiles 512 to prevent unnecessary curtailment and/or reduce the duration of feed-in limit violations, in accordance with various embodiments of the present principles.

Figure 6:
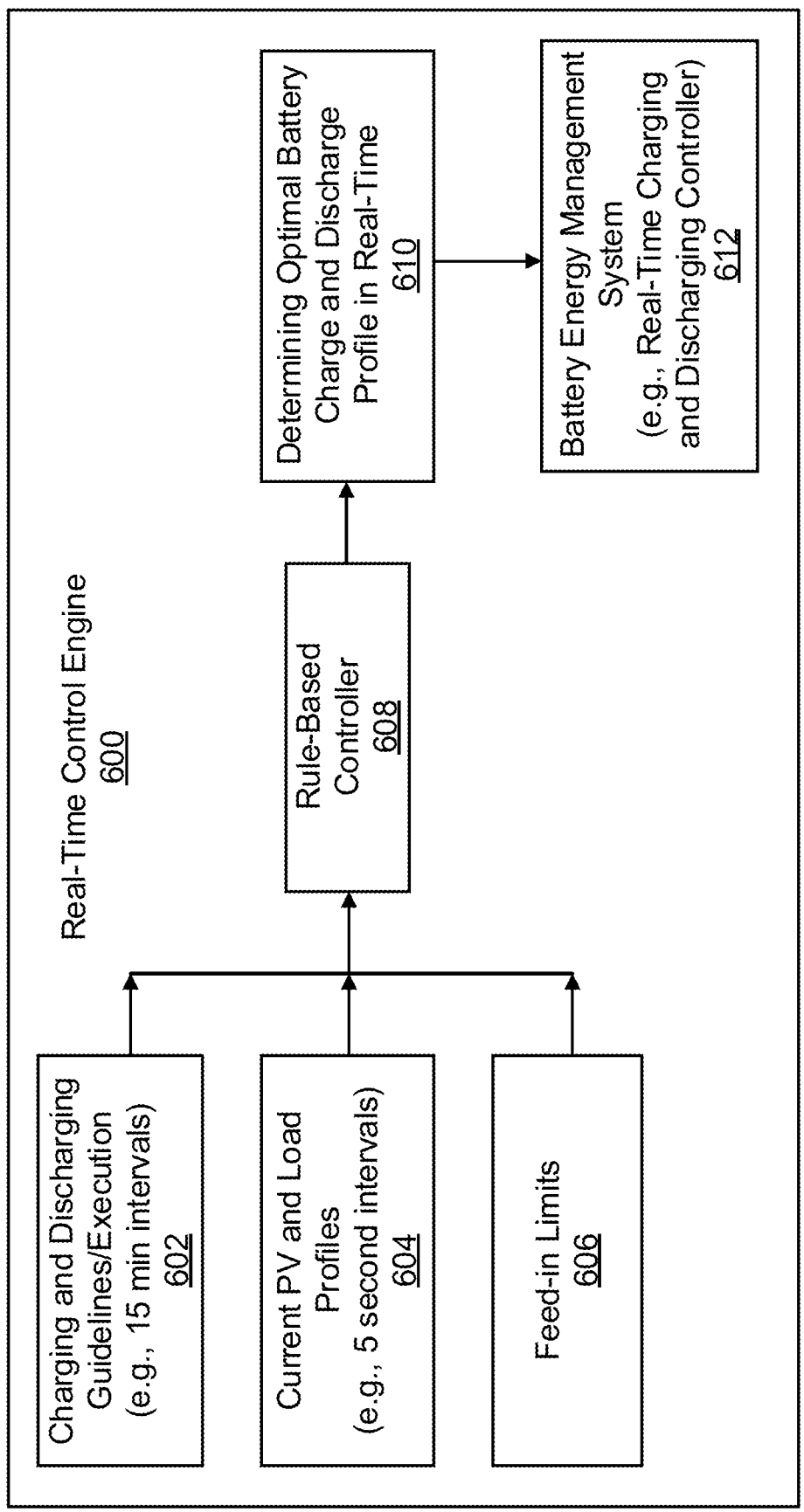
FIG. 6 is a high-level block/flow diagram illustrating a system/method for real-time control for management of energy storage systems, in accordance with the present principles.

Referring now to FIG. 6, a high-level block/flow diagram showing a system/method 600 for real-time control for management of energy storage systems is illustratively depicted in accordance with an embodiment of the present principles.

In one embodiment, charging and discharging guidelines 602 for regular time intervals (e.g., 15 minute intervals), current PV and load profiles for regular intervals 604 (e.g., 5 second intervals), and feed in limits 606 are input into a rule-based controller 608, and if determined to be necessary by the system, charging and discharging profiles may be overridden based on Algorithm 1, above, to ensure proper charging in the case of possible feed in violation and discharging in the case of DC violations by determining optimal battery charge and discharge profiles in real time in block 610, in accordance with the present principles.

In some embodiments, the power charging/discharging functions can be controlled based on the optimal battery charge and discharge profiles generated in block 610 using the battery energy management system in block 612. The real-time control engine 600 can override the model predictive control guidelines to ensure satisfactory performance in case of, for example, high excess PV generation and peak shaving event, in accordance with the present principles. The real-time control engine 600 provides implementation in faster time-scales, and therefore, the control engine 600 can be used for successful implementation of optimal charging/discharging for one or more energy consumers (e.g., commercial building, residential building, etc.) in a faster time scale (e.g. order of seconds) than any conventional systems and methods.

Figure 7:
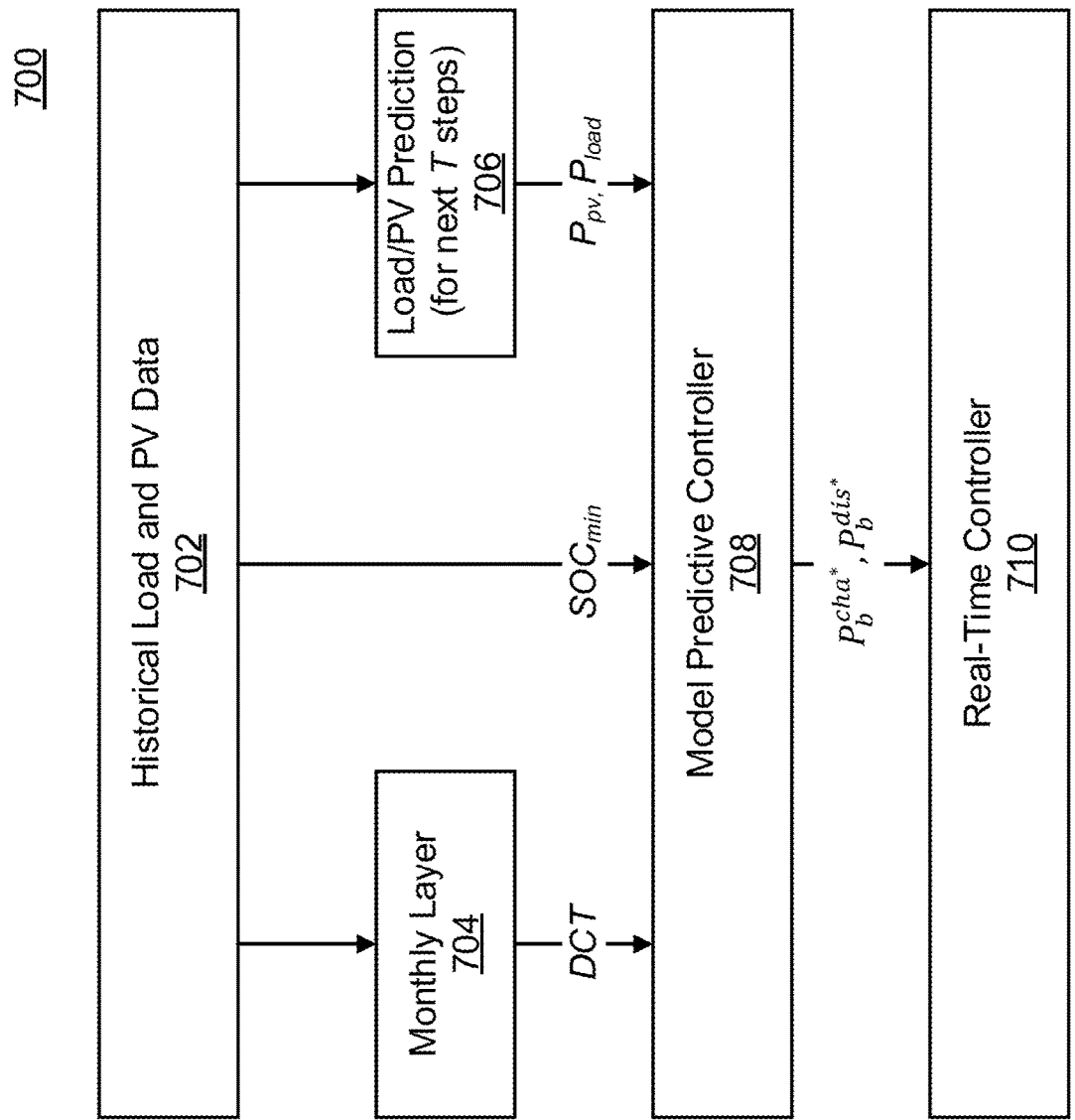
FIG. 7 is a block/flow diagram illustrating a system/method for real-time control for management of energy storage systems using a model predictive controller (MPC), in accordance with the present principles.

Referring now to FIG. 7, a block/flow diagram showing a system/method 700 for real-time control for management of energy storage systems using a model predictive controller (MPC) is illustratively depicted in accordance with an embodiment of the present principles. The system/method 700 provides optimized charging/discharging functions and can address demand charge management (DCM) and PV-utilization simultaneously, in accordance with the present principles.

In one embodiment, historical load and PV data 702 may be input into a monthly layer 704 to generate demand charge thresholds (DCTs), and may be used for PV/load profile prediction (e.g. for the next T steps) in block 706, using, for example, before by performing, for example, an AutoRegressive Integrated Moving Average (ARIMA) in accordance with the present principles. The historical load and PV data 702 may be employed to determine a minimum SOC (e.g., as determined in block 414 of FIG. 4), which may be input into a model predictive controller 708 along with the determined DCT from the monthly layer 704 and the Load/PV prediction from block 706 in accordance with the present principles. For illustrative purposes, in the daily layer (e.g., model predictive controller) 708, it may be assumed that a finite time partitioned into T discrete time intervals, indexed by t∈{1, 2, . . . , T} is considered in accordance with various embodiments. In some embodiments, a finite horizon constrained optimization problem may be performed to generate optimal charging/discharging guidelines as follows:

$$\min J = \sum_{t=1}^{T} P_g^{sell}(t) + C_{tp}(P_b^{cha}(t) + P_b^{dis}(t)) \tag{6a}$$

$$\text{s.t.} \quad SOC_{min} \le SOC(t) \le SOC_{max} \tag{6b}$$

$$SOC(t+1) = SOC(t) + P_b^{cha}(t) - P_b^{dis}(t) \tag{6c}$$

$$P_g^{sell}(t) = P_g^{pur}(t) + P_b^{dis}(t) - P_b^{cha}(t) + P_{pv}(t) - P_{load}(t) \tag{6d}$$

$$P_g^{pur}(t) \le DCT(t) \tag{6e}$$

$$0 \le P_b^{dis}(t), P_b^{cha}(t) \le P_b^{max} \tag{6f}$$

In various embodiments, the objective function (6a) minimizes the total excess PV generation sold to the grid and the battery degradation cost. Constraints (6b) and (6c) represent the battery SOC limits and dynamic equation, respectively. These constraints can be used to keep the SOC within the predefined boundaries in order to keep the energy storage healthier and operate within higher efficiency region. Constraint (6d) is designed to take account the physics of the system, (6e) guarantees that the DC thresholds will not be violated and (6f) represents the battery operational boundaries, in accordance with the present principles.

An objective of the monthly layer is to calculate the optimal peak grid powers to follow during the next billing cycle. These target grid powers are calculated based on regular, predetermined time intervals (e.g., 15-minute intervals) and are referred to as demand charge thresholds (DCTs). It is noted that PV-utilization is a daily problem. However, demand charge is a monthly problem and may be already defined using historical data for the current month. As a result, during daily operation, the aggregated system can efficiently provide power by following predefined thresholds (e.g., DCTs) calculated in the monthly layer, in accordance with the present principles.

In some embodiments, the optimal charging/discharging guidelines are determined for one or more BESSs, and are marked for illustrative purposes with a "*" as $P_b^{cha*}(t)$ and $P_b^{dis*}(t)$, respectively. The optimal charging/discharging functions based on the determined guidelines consequently promotes the battery to discharge in hours before high PV generations and/or charge in hours before peak demands. However, the above optimization problem (e.g., 6a) does not consider the case where DCT might be violated or SOC is lower than $SOC_{min}$, which may lead to an infeasibility problem. Therefore, to prevent any such issues, a model predictive controller 708 can be employed in accordance with various embodiments of the present principles to reformulate the overall optimization using soft constraints as follows:

$$\min J = \tag{7a}$$

$$\sum_{t=1}^{T} P_g^{sell}(t) + C_{tp}(P_b^{cha}(t) + P_b^{dis}(t)) + \alpha \times SOC_{min}^{slack} + \beta \times DCT^{slack}$$

$$\text{s.t.} \quad SOC_{min} - SOC_{min}^{slack} \le SOC(t) \le SOC_{max} \tag{7b}$$

$$SOC(t+1) = SOC(t) - P_b^{dis}(t) + P_b^{cha}(t) \tag{7c}$$

$$P_g^{sell}(t) = P_g^{pur}(t) + P_b^{dis}(t) - P_b^{cha}(t) + P_{pv}(t) - P_{load}(t) \tag{7d}$$

$$P_g^{pur}(t) - DCT^{slack} \le DCT(t) \tag{7e}$$

$$0 \le P_b^{dis}(t), P_b^{cha}(t) \le P_b^{max} \tag{7f}$$

In accordance with the present principles, variables α and β are weightings for $SOC^{slack}$ and $DCT^{slack}$, respectively. The slack variables are added to avoid the hard constraint of threshold violations. This approach provides guidelines and a control mechanism to reduce the demand charge cost and increase the PV-utilization rate in accordance with various embodiments. Variables $P_{load}$ and $P_{pv}$ comes from the estimated values of load and PV profiles for the next T steps, as determined in block 706. The only variables that need to be selected is $SOC_{min}$, (e.g., as determined in block 414 of FIG. 4), which can be selected based on the average minimum required battery capacity for peak shaving of the previous days, in accordance with the present principles.

In some embodiments, a real-time controller 710 may receive optimal charging/discharging guidelines (e.g., $P_b^{cha*}(t)$ and $P_b^{dis*}(t)$, respectively) as input from the MPC 708. The MPC 708 determines optimal charging/discharging profiles for regular intervals (e.g., 15-minute intervals), which can then be sent to the real-time controller 710 for further processing to further improve the efficiency and battery lifetime for one or more BESSs in accordance with the present principles.

Although these profiles are optimally calculated using the MPC 708, additional adjustments to further improve actual operation of one or more BESSs may be performed by the real time controller 710 to overcome possible forecasting errors and to enable successful implementation in faster time scales (e.g. order of seconds) using Algorithm 2, below:

---
Algorithm 2: Real-time Controller
---
Case 1:     if $(P_g(t) > DCT(t))$ & $(SOC(t) > SOC_{min})$
            $P_b^{cha}(t) = 0$
            $P_b^{dis}(t) = P_g(t) - DCT(t)$
Case 2:     if $(P_g(t) < 0)$ & $(SOC(t) < SOC_{max})$
            $P_b^{cha}(t) = P_g(t)$
            $P_b^{dis}(t) = 0$
Otherwise:     $P_b^{cha}(t) = P_b^{cha*}(t)$
            $P_b^{dis}(t) = P_b^{dis*}(t)$
---

In the above algorithm, a discharging profile may be overridden by the real-time controller 710 to avoid DCT violations in case, for example, the SOC is higher than the minimum value. Similarly, a charging profile may be overridden by the real-time controller 710 to increase the local PV-utilization in case, for example, the SOC is lower than the predefined maximum value in accordance with various embodiments of the present principles.

Extensive simulations have been performed to test the real-world performance of the system/method 700 using real data for different load profiles, battery sizes, and optimization time horizons. For simplicity of illustration, the optimization problem (e.g., equation 7) has been solved using GNU Linear Programming Kit (GLPK) software based on 15-minute intervals. However, it is noted that the system/method 700 can be applied for any other time scales in accordance with various embodiments. In order to compare differences in electricity demand patterns, the peak loads were scaled to 420 kW and the PV penetration is assumed to be 90% in all the cases. In this study, PV penetration is defined as the ratio of peak PV power to peak load power. The optimization time horizon is assumed to be 4-hours (T=16 steps) which can be changed based on the PV/load forecast accuracy, and the battery size is chosen as 340 kWh/710 kW, unless otherwise stated. The weighting functions and gains are chosen as follows: $\alpha=10$, $\beta=100$, and Ctp=0.05, where Ctp is the battery throughput cost ($/kW). Demand charge cost is calculated using rates from Pacific Gas and Electric (PG&E) markets for customers.

For illustrative purposes, three separate case studies, including load profiles of a grocery store, theater, and hospital have been considered to evaluate the present invention. Based on these real-world case studies, it is shown that the grocery store load profile is flatter in comparison to the theater profile with longer peak duration (e.g., happens late at nights) and hospital demand profile (which is more aligned with PV generation pattern). The PV profile used in this study was measured at a fixed rooftop PV installation.

An overview of daily BESS operation and resulting profiles for grocery load with rule-based controller and the proposed MPC-based controller has been determined in the case studies. In the case of using only a rule-based controller, the battery is fully charged after the peak shaving event in the morning and consequently cannot absorb the excess PV production. However, the system/method 700 in accordance with the present principles significantly reduces the excess PV injection to the grid and it is evident that the BESS is scheduled for charging during excess PV generation and discharging during Peak demand. Employing this method significantly improves the annual PV-utilization from 0.008% in the case of a rule-based controller to 71.15% using the real-time controller 710 in accordance with the present principles. As a result, the effectiveness of the MPC-based controller 710 is evident in reducing the excess PV injection and following the DC thresholds in accordance with various embodiments.

The determined monthly effects of reducing excess PV injection clearly indicates that the excess PV injection to the grid reduces significantly as duration and magnitude of $P_{sell}$ decreased using the MPC-based controller 710. The annual simulation results for different load profiles reveal that the system/method 700 was able to significantly enhance the PV-utilization rate from between 60% to 80% while slightly decreasing the demand charge savings below 2.5%. Moreover, the system/method 700 also reduces the average annual SOC and has the added benefits of increasing the battery lifetime. It can also be seen that the hospital load has the highest PV-utilization rate because its profile is more aligned with PV demand pattern.

To evaluate the effects of optimization horizon, simulations have been repeated for different time windows. For illustrative purposes, we choose the grocery store load profile, which shows that the performance of the system/method 700 in terms of DC saving (which is a primary application) is not sensitive to optimization horizon. However, increasing the horizon can improve the overall PV-utilization ratio from, for example, 59% for 3-hours to 80% for 5-hours time horizon. Generally, choosing a proper time horizon is a trade-off between forecast accuracy and the information needed for optimal planning. Different battery sizes have also been considered to evaluate the effects on the performance of the system/method 700 in the case of the grocery store load. The results reveal that increasing the battery size will improve the PV-utilization rate. Generally, this is expected as bigger batteries have a higher capacity to shift the load and excess PV-generation.

Figure 8:
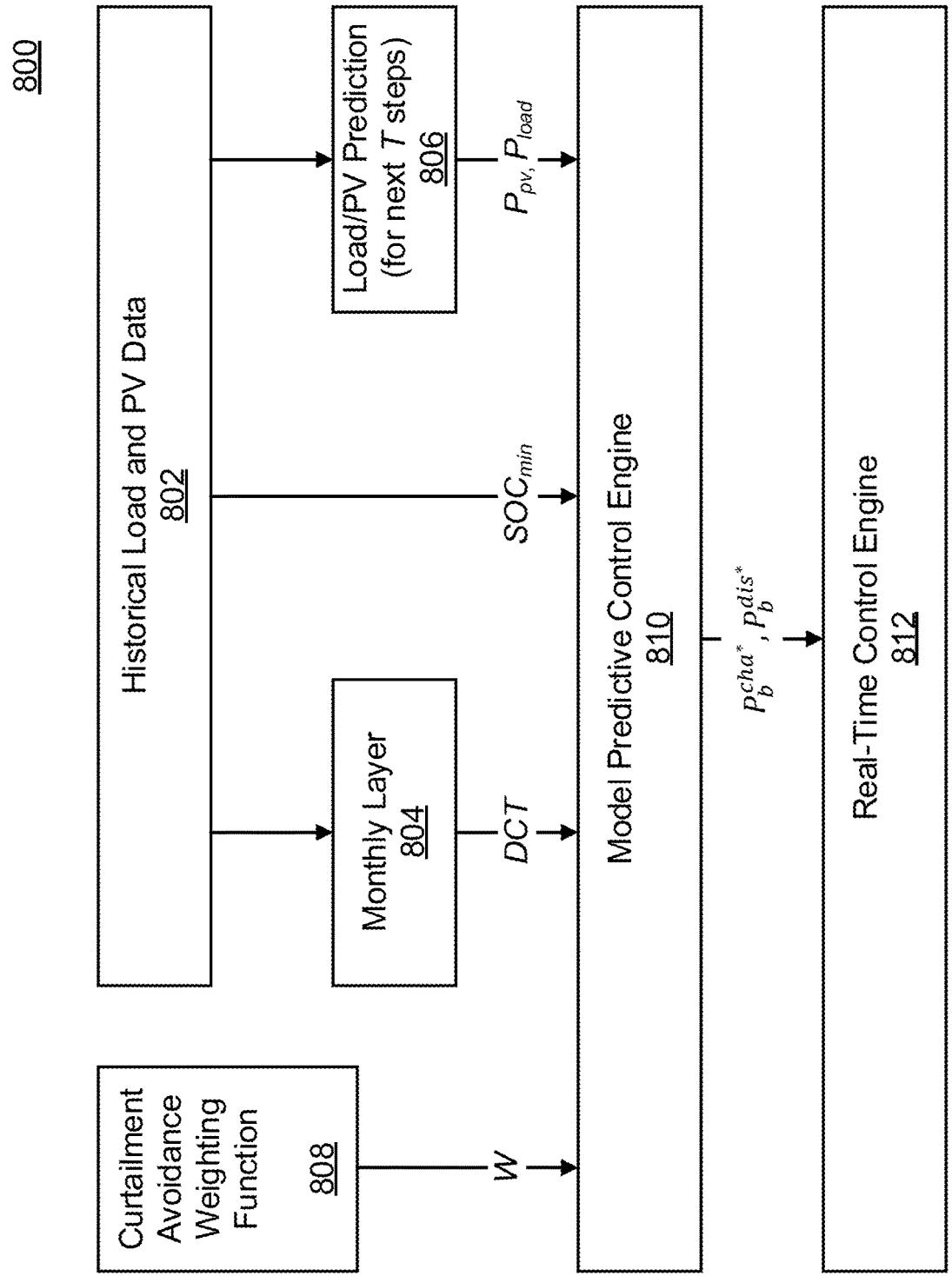
FIG. 8 is a block/flow diagram illustrating a system/method for real-time control for management of energy storage systems using a model predictive controller (MPC) with curtailment avoidance, in accordance with the present principles.

Referring now to FIG. 8, a block/flow diagram showing a system/method 800 for real-time control for management of energy storage systems using a model predictive controller (MPC) with curtailment avoidance is illustratively depicted in accordance with an embodiment of the present principles.

In an illustrative embodiment, the system/method 800 considers feed in-limitations (e.g., $P_{lim}=-20$ kW) for providing optimal charging/discharging functions in accordance with the present principles. Some other parameters that may be considered are as follows:

$$P_g^{curt} \begin{cases} P_g, & \text{if } P_g \geq P_{lim} \\ P_{lim}, & \text{if } P_g < P_{lim} \end{cases} \quad (8)$$

$$\text{Curtailment loss } (CL) = \frac{|\Sigma P_g - \Sigma P_g^{curt}|}{\Sigma P_{pv}} \times 100 \quad (9)$$

$$PV\text{-utilization } (UT) = 1 - \frac{E_{sell,\text{with BESS}}}{E_{sell,\text{without BESS}}} \times 100 \quad (10)$$

In one embodiment, historical load and PV data 802 is used to determine the minimum required SOC ($SOC_{min}$) for peak shaving of the previous day. DCT is determined by the monthly layer in block 804, load/PV prediction is performed in block 806, and a curtailment avoidance weighting function (W) is performed in block 808 in accordance with the present principles. A weighted average can be used to estimate the required amount of energy for the successful peak shaving of the next day, and the $SOC_{min}$ value can be sent to the model predictive control (MPC) engine 810 as input for generating optimal charging/discharging guidelines in accordance with the present principles. In some embodiments, $SOC_{min}$ may be determined as follows:

$$SOC_{min} = \frac{\sum_{d=1}^{n} w_d * SOC_{min,d}}{\sum_{d=1}^{n} w_d}$$

where d is the day index (e.g. historical day 1, historical day 2, . . . ), $SOC_{min,d}$ is the $SOC_{min}$/required SOC value for successful peak shaving of day d, and $w_d$ is the weighting variable for day d.

In accordance with various embodiments, the model predictive control engine 810 may employ the following optimization setup to resolve the problems of demand charge management, PV utilization, and curtailment avoidance (e.g., 15-minute interval timescale) in accordance with the present principles as follows:

$$\min J = \sum_{t=1}^{T} P_g^{sell}(t) + C_{tp}(P_b^{cha}(t) + P_b^{dis}(t)) + \alpha_0 \times SOC_{min}^{slack} + \quad (11a)$$

$$\beta_0 DCT^{slack} + W(P_{lim}^{slack})P_{lim}^{slack}$$

$$\text{s.t.} \quad SOC_{min} - SOC_{min}^{slack} \leq SOC(t) \leq SOC_{max} \quad (11b)$$

$$SOC(t+1) = SOC(t) - P_b^{dis}(t) + P_b^{cha}(t) \quad (11c)$$

$$P_g^{sell}(t) = P_g^{pur}(t) + P_b^{dis}(t) - P_b^{cha}(t) + P_{pv}(t) - P_{load}(t) \quad (11d)$$

$$P_g^{pur}(t) - DCT^{slack} \leq DCT(t) \quad (11e)$$

$$P_g^{sell}(t) - P_{lim}^{slack} \leq -P_{lim} \quad (11f)$$

$$0 \leq P_b^{dis}(t), P_b^{cha}(t) \leq P_b^{max}, \quad (11g)$$

where $\alpha_0$ and $\beta_0$ represent weightings for $SOC_{min}$ and DCT violations, respectively.

In the above optimization performed by the MPC engine 810, W(x) is a weighting function for curtailment avoidance and the feed-in limit violation can be defined as $x=P_{lim}^{slack}$. Different weightings can be used depending on, for example, the particular application and/or grid requirements. Some exemplary weightings that may be employed in accordance with the present principles are constant weighting, linear weighting, and nonlinear weighting.

In the case of constant weighting, a constant weight $W(x)=\gamma_0$, where $\gamma_0 \in \Re^+$ may be selected, and as a result, any injection to the grid that violates the limit is considered as having the same importance. In this embodiment, all injections to the grid may be multiplied with the same constant value $\gamma_0$, and thus, all injections to the grid have the same weight/importance in the optimization. In the case of linear weighting, a linear weighting function $W(x)=\gamma x+\gamma_0$ can be considered, where $\gamma, \gamma_0 \in \Re^+$, where $\gamma_0$ is a constant value used for curtailment avoidance, and $\Re^+$ means space of a positive real number, and thus, $\gamma_0$ is chosen from a positive real number. Therefore, violations with a greater magnitude are penalized with a greater penalty as the violation increases. Greater magnitude means x is larger, and thus W(x) is also larger, which results in a higher penalty. Hence, they will be reduced further in the optimization using the term $W(P_{lim}^{slack})P_{lim}^{slack}$, in accordance with the present principles.

In the case of nonlinear weighting, a nonlinear continuous weighting function W(x) is defined to penalize the violations in a nonlinear fashion. For example, in some embodiments, exponential functions $W(x)=\gamma_0 \exp(x)$ can be used to assign exponentially increasing penalties over the grid feed-in violations in the optimization using the term $W(P_{lim}^{slack})$ $P_{lim}^{slack}$, in accordance with various embodiments. As compared to a constant weighting function, use of linear and/or nonlinear weightings by the MPC engine 810 can significantly reduce the amplitude of maximum sell-back to the grid. This feature is important in preventing voltage and/or power quality problems in a power distribution network, in accordance with the present principles.

In some embodiments, a real-time control engine 812 may be employed to determine optimal charging/discharging profiles based on the output of the MPC engine 810 and/or to control the charging/discharging functions of one or more BESSs in accordance with the present principles. The real-time control engine 812 may employ the following algorithm using input from the MPC engine:

| Algorithm 3: Real-time Control Engine | |
|---|---|
| Case 1: | if ($P_g(t) >$ DCT(t)) & (SOC(t) > $SOC_{min}$) <br> $P_b^{cha}(t) = 0$ <br> $P_b^{dis}(t) = P_g(t) - $ DCT(t) |
| Case 2: | if ($P_g(t) < 0$) & (SOC(t) < $SOC_{max}$) <br> $P_b^{cha}(t) = P_g(t)$ <br> $P_b^{dis}(t) = 0$ |
| Otherwise: | $P_b^{cha}(t) = P_b^{cha*}(t)$ <br> $P_b^{dis}(t) = P_b^{dis*}(t)$ | where $P_b^{cha*}(t)$ and $P_b^{dis*}(t)$ are the optimal charging/discharging profiles calculated using the MPC control engine 810 in accordance with the present principles. Experimental results have shown that the MPC engine (with PV-utilization and curtailment avoidance) can follow (e.g., not violate) the monthly DCT, improve the local PV-utilization, and avoid violations of feed-in limits ($P_{lim}$) in accordance with various embodiments of the present principles.

Figure 9:
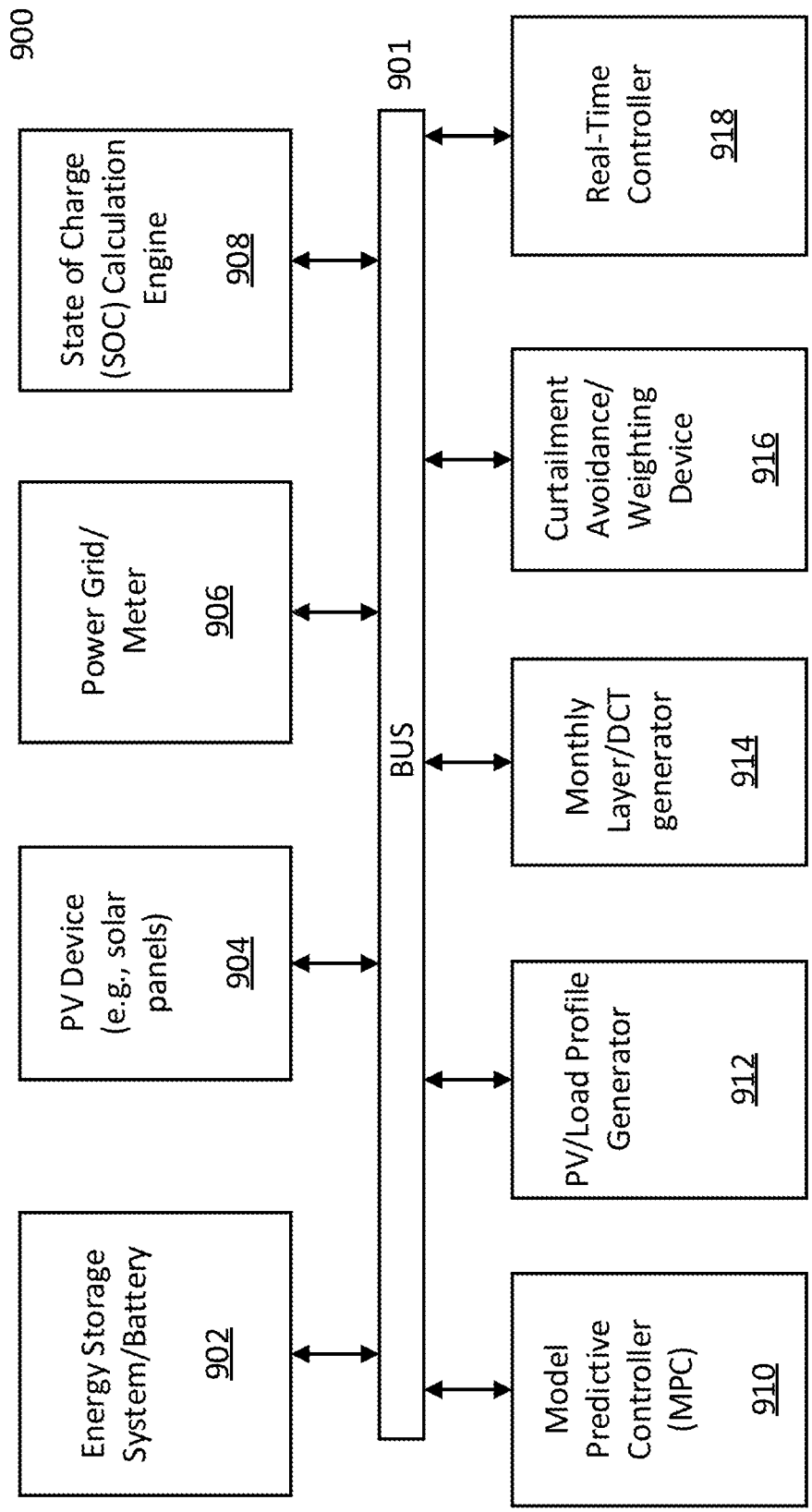
FIG. 9 is a block/flow diagram illustrating a system for real-time control for management of energy storage systems, in accordance with the present principles.

Referring now to FIG. 9, a block/flow diagram of a system 900 for real-time control for management of energy storage systems is illustratively depicted in accordance with an embodiment of the present principles.

In various embodiments, one or more Energy Storage Systems 902 (e.g., BESSs) can be operatively connected to one or move PV devices 904 (e.g., solar panels), and may be further operatively connected to a meter and/or power grid 906 in accordance with the present principles. In block 908, a state of charge (SOC) calculation engine can calculate a minimum required SOC based on, for example, historical PV/load profiles, DC thresholds, and/or battery capacity, and the results can be passed onto a Model Predictive Controller 910 (MPC) as input. In block 910, the MPC 910 can be employed to determine optimal charging/discharging profiles for any of a plurality of intervals (e.g., 15-minute intervals).

In block 912, A PV/load profile generator estimates PV/load profiles using, for example, AutoRegressive Integrated Moving Average (ARIMA) models, which may be determined based on input including feed-in limits and DC thresholds in accordance with the present principles. In block 914, a monthly layer 914 may calculate one or more DCTs, and a curtailment avoidance/weighting device 916 may be employed to prevent unnecessary curtailment while minimizing DC cost in accordance with various embodiments. A real time controller 918 can be operatively connected to one or more BESSs 902 (e.g., locally or remotely), and can control one or more of a plurality of functions (e.g., charging, discharging, emergency management, etc.) of the one or more BESSs 902 based on, for example, the optimal charging/discharging profiles generated by the MPC 910, the output of the curtailment avoidance weighting device 916, etc. The controller 918 further improve the efficiency and battery lifetime for one or more BESSs 902 by optimally charging and/or discharging the BESSs 902 in accordance with various embodiments of the present principles.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention. Having thus described aspects of the invention, with the details and particularity required by the patent laws, what is claimed and desired protected by Letters Patent is set forth in the appended claims.

What is claimed is:

1. A computer implemented method for controlling one or more Battery Energy Storage Systems (BESSs), comprising:
   determining a historical minimum state of charge (SOC) for peak shaving of a previous day based on historical photovoltaic (PV) and load profiles, historical demand charge thresholds (DCT), and battery capacity of the one or more BESSs;
   estimating a minimum SOC for successful peak shaving of a next day by generating a weighted average based on the historical minimum SOC;
   generating optimal charging and discharging profiles for predetermined intervals based on estimated PV and load profiles for a next selected time period and grid feed-in limitations; and
   providing continuous optimal charging and discharging functions for the one or more BESSs using a real-time controller configured for overriding the optimal charging and discharging profiles when at least one of a high excess PV generation, a peak shaving event, or a feed-in limit violation is detected.

2. The method as recited in claim 1, wherein the optimal charging and discharging functions include discharging the one or more BESSs in hours before predicted high PV generation and charging in hours before predicted peak demand.

3. The method as recited in claim 1, wherein the controller is further configured for preventing DCT violations by overriding one or more of the discharging profiles when a SOC higher than the minimum SOC is detected.

4. The method as recited in claim 1, wherein the controller is further configured for increasing local PV-utilization by overriding one or more of the charging profiles when a SOC lower than a predefined maximum value is detected.

5. The method as recited in claim 1, further comprising selecting predefined SOC boundaries for the one or more BESSs, and operating the one or more BESSs within the SOC boundaries to prevent DCT violations and to maximize battery life for the one or more BESSs.

6. The method as recited in claim 1, wherein the weighted average is based on a curtailment avoidance weighting function.

7. The method as recited in claim 6, wherein the curtailment avoidance weighting function is configured for maximizing local PV-utilization, reducing voltage fluctuations, and minimizing loss for the one or more BESSs.

8. A system for controlling one or more Battery Energy Storage Systems (BESSs), comprising:
   a processor device operatively coupled to a non-transitory computer-readable storage medium, the processor being configured for:
      determining a historical minimum state of charge (SOC) for peak shaving of a previous day based on historical photovoltaic (PV) and load profiles, historical demand charge thresholds (DCT), and battery capacity of the one or more BESSs;
      estimating a minimum SOC for successful peak shaving of a next day by generating a weighted average based on the historical minimum SOC;
      generating optimal charging and discharging profiles for predetermined intervals based on estimated PV and load profiles for a next selected time period and grid feed-in limitations; and
      providing continuous optimal charging and discharging functions for the one or more BESSs using a real-time controller configured for overriding the optimal charging and discharging profiles when at least one of a high excess PV generation, a peak shaving event, or a feed-in limit violation is detected.

9. The system as recited in claim 8, wherein the optimal charging and discharging functions include discharging the one or more BESSs in hours before predicted high PV generation and charging in hours before predicted peak demand.

10. The system as recited in claim 8, wherein the controller is further configured for preventing DCT violations by overriding one or more of the discharging profiles when a SOC higher than the minimum SOC is detected.

11. The system as recited in claim 8, wherein the controller is further configured for increasing local PV-utilization by overriding one or more of the charging profiles when a SOC lower than a predefined maximum value is detected.

12. The system as recited in claim 8, wherein the processor is further configured for selecting predefined SOC boundaries for the one or more BESSs, and for operating the one or more BESSs within the SOC boundaries to prevent DCT violations and to maximize battery life for the one or more BESSs.

13. The system as recited in claim 8, wherein the weighted average is based on a curtailment avoidance weighting function.

14. The system as recited in claim 13, wherein the curtailment avoidance weighting function is configured for maximizing local PV-utilization, reducing voltage fluctuations, and minimizing loss for the one or more BESSs.

15. A non-transitory computer readable storage medium comprising a computer readable program for controlling one or more Battery Energy Storage Systems (BESSs), wherein the computer readable program when executed on a computer causes the computer to perform the steps of:
   determining a historical minimum state of charge (SOC) for peak shaving of a previous day based on historical photovoltaic (PV) and load profiles, historical demand charge thresholds (DCT), and battery capacity of the one or more BESSs;

estimating a minimum SOC for successful peak shaving of a next day by generating a weighted average based on the historical minimum SOC;

generating optimal charging and discharging profiles for predetermined intervals based on estimated PV and load profiles for a next selected time period and grid feed-in limitations; and providing continuous optimal charging and discharging functions for the one or more BESSs using a real-time controller configured for overriding the optimal charging and discharging profiles when at least one of a high excess PV generation, a peak shaving event, or a feed-in limit violation is detected.

16. The computer readable storage medium as recited in claim 15, wherein the optimal charging and discharging functions include discharging the one or more BESSs in hours before predicted high PV generation and charging in hours before predicted peak demand.

17. The computer readable storage medium as recited in claim 15, wherein the controller is further configured for preventing DCT violations by overriding one or more of the discharging profiles when a SOC higher than the minimum SOC is detected.

18. The computer readable storage medium as recited in claim 15, wherein the controller is further configured for increasing local PV-utilization by overriding one or more of the charging profiles when a SOC lower than a predefined maximum value is detected.

19. The computer readable storage medium as recited in claim 15, wherein the controller is further configured for operating the one or more BESSs within predefined, user-selected SOC boundaries to prevent DCT violations and to maximize battery life for the one or more BESSs.

20. The computer readable storage medium as recited in claim 15, wherein the weighted average is based on a curtailment avoidance weighting function, and the curtailment avoidance weighting function is configured for maximizing local PV-utilization, reducing voltage fluctuations, and minimizing loss for the one or more BESSs.

* * * * *